(12) United States Patent
Rendler et al.

(10) Patent No.: US 12,328,953 B2
(45) Date of Patent: Jun. 10, 2025

(54) SOLAR CELL MODULE

(71) Applicant: Fraunhofer-Gesellschaft zur Förderung der angewandten Forschung e.V., Munich (DE)

(72) Inventors: Li Carlos Rendler, Freiburg (DE); Max Mittag, Freiburg (DE); Holger Neuhaus, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/033,889

(22) PCT Filed: Oct. 14, 2021

(86) PCT No.: PCT/EP2021/078461
§ 371 (c)(1),
(2) Date: Apr. 26, 2023

(87) PCT Pub. No.: WO2022/089947
PCT Pub. Date: May 5, 2022

(65) Prior Publication Data
US 2023/0411546 A1    Dec. 21, 2023

(30) Foreign Application Priority Data

Oct. 26, 2020   (DE) .......................... 102020128080.7

(51) Int. Cl.
*H10F 19/90* (2025.01)
*H10F 19/70* (2025.01)

(52) U.S. Cl.
CPC ........... *H10F 19/904* (2025.01); *H10F 19/70* (2025.01)

(58) Field of Classification Search
None
See application file for complete search history.

(56) References Cited

U.S. PATENT DOCUMENTS

2015/0349176 A1   12/2015   Morad et al.
2016/0141435 A1   5/2016    Spidhara et al.
(Continued)

FOREIGN PATENT DOCUMENTS

CN   109301010   2/2019
CN   109390417   2/2019
(Continued)

*Primary Examiner* — Ryan S Cannon
(74) *Attorney, Agent, or Firm* — Volpe Koenig

(57) ABSTRACT

A solar cell module, having at least four module segments and a plurality of bypass elements. Each module segment includes at least two solar cell strings connected in parallel and each string includes multiple solar cells connected in series and the four module segments are connected in series. The second and third module segments are connected in series between first and fourth module segments and the four module segments are arranged in two parallel series, having a first series which includes the first and the second module segment and a second series which includes the third and the fourth module segment. A first bypass element is connected in parallel to the first module segment, a second bypass element is connected in parallel to the second and third module segments connected in series, and a third bypass element is connected in parallel to the fourth module segment.

13 Claims, 15 Drawing Sheets

(56) References Cited

U.S. PATENT DOCUMENTS

| | | | |
|---|---|---|---|
| 2016/0226438 A1* | 8/2016 | Gibson | ................ H01L 31/044 |
| 2016/0226439 A1 | 8/2016 | Gibson | |
| 2017/0179324 A1 | 6/2017 | Yang et al. | |
| 2019/0051789 A1* | 2/2019 | Morad | ................ H01L 31/048 |
| 2020/0313017 A1 | 10/2020 | Nanba | |

FOREIGN PATENT DOCUMENTS

| | | |
|---|---|---|
| CN | 110197858 | 9/2019 |
| CN | 111668333 | 9/2020 |
| CN | 111725345 | 9/2020 |
| DE | 102005012213 | 1/2009 |
| DE | 102009060604 | 6/2011 |
| DE | 102011055754 | 12/2012 |
| EP | 2249394 | 11/2010 |
| GB | 2564123 | 1/2019 |
| WO | 2015001413 | 1/2015 |
| WO | 2019155280 | 8/2019 |

* cited by examiner

SOLAR CELL MODULE

CROSS-REFERENCE TO RELATED APPLICATIONS

This application is a 371 National Phase of International Application No. PCT/EP2021/078461, filed Oct. 14, 2021, which claims priority from German Patent Application No. 10 2020 128 080.7, filed Oct. 26, 2020, both of which are incorporated herein by reference as if fully set forth.

TECHNICAL FIELD

The invention relates to a solar cell module.

BACKGROUND

Solar cells are sensitive semiconductor components. To protect them from environmental influences so they have long-term resistance and to achieve manageable electrical output parameters, solar cells are typically electrically connected and encapsulated in a module structure.

Partial shading, in which individual solar cells are entirely or partially shaded, for example by soiling or by objects casting shadows on the solar cell module, is problematic in the use of solar cell modules. In the event of partial shading, on the one hand, the electrical output power of the entire solar cell module can be significantly reduced or sink to zero. On the other hand, partial shading can result in significant heating of the partially shaded solar cell, so that there is the risk of damage to the solar cell and the module structure. Connecting bypass diodes in parallel to multiple solar cells is therefore known, so that in the case of partial shading in a section of the solar cell module, the solar cells are bypassed in this section via the bypass diode.

A solar cell module therefore typically includes multiple module segments, wherein each module segment can include multiple solar cell strings connected in parallel. A solar cell string includes multiple solar cells connected in series.

Different configurations of module segments of a solar cell module are known from US 2016/0226439 A1, wherein one bypass diode connected in parallel is associated in each case with each module segment. A solar cell module having multiple module segments and bypass diodes arranged in the middle in the solar cell module is known from WO2015/001413.

SUMMARY

The present invention is based on the object of providing a simplified structure of a solar cell module, which nonetheless does not result in total failure of the solar cell module in the event of shading of solar cells of the solar cell module at an arbitrary edge of the module.

This object is achieved by a solar cell module having one or more of the features disclosed herein. Advantageous embodiments are found in the description below and in the claims.

The solar cell module according to the invention includes at least four module segments and a plurality of bypass elements.

Each of the four module segments includes at least two solar cell strings connected in parallel. Each solar cell string includes a plurality of solar cells connected in series.

The four module segments are connected in series, wherein a second and a third of the four module segments are connected in series between a first and a fourth of the four module segments. The four module segments are thus connected in series in the numbering sequence 1, 2, 3, 4.

Furthermore, the four module segments are arranged in two parallel series, having a first series, which includes the first and the second module segment, and a second series, which includes the third and the fourth module segment. Accordingly, the arrangement thus includes a first column of module segments having the first and the fourth module segment and a second column of module segments having the second and the third module segment.

It is essential that a first bypass element is connected in parallel to the first module segment, a second bypass element is connected in parallel to the second and third module segments connected in series, and a third bypass element is connected in parallel to the fourth module segment.

In contrast to previously known configurations, the solar cell module according to the invention thus includes at least four module segments connected in series, wherein the two middle module segments of the series circuit (module segment 2 and 3) are secured from partial shading by a common bypass element connected in parallel to these two module segments.

In combination with the mentioned arrangement in two parallel series, on the one hand, a simplified and more cost-effective structure thus results, in which in particular one bypass element can be saved in comparison to previously known configurations and nonetheless partial shading of solar cells at an arbitrary edge of the solar cell module merely results in a partial reduction of the output power, but not in a complete failure. Furthermore, a solar cell module having comparable dimensions and comparable electrical characteristic data to standard modules can be formed by this configuration, so that a use in structures known per se is possible.

In the majority of the configurations known from the prior art, it is necessary for a bypass element to be electrically connected to two opposing ends of a module segment to achieve a parallel connection. This requires connecting lines for the bypass element, which typically have to have the length of a module segment, in particular at least the length of a solar cell string of the module segment.

The solar cell module according to the invention enables an arrangement of the second bypass element, so that significantly shorter connecting lines are necessary for the parallel connection of the second bypass element:

In one advantageous embodiment, the second bypass element is arranged between the first and the second series, in particular in the middle between the first and the second series. In particular, it is advantageous that the bypass element is additionally arranged between the first and the second column, in particular in the middle between the first and the second column, of the four module segments.

It is therefore advantageous that the second bypass element is arranged in a middle area, at which the four module segments adjoin. In this way, as described above, shorter connecting lines for the parallel connection of the second bypass element are enabled.

An advantageously structurally simple design results in an advantageous embodiment in which a first cross connector is arranged between first and second module segment for the parallel connection of the solar cell strings of the first and/or the second module segment and a second cross connector is arranged between third and fourth module segment for the parallel connection of the solar cell strings of the third and/or the fourth module segment. Furthermore, the second bypass element is connected between the first and the second cross connector.

The advantage results in this way that the cross connectors can be used, on the one hand, for the parallel connection of solar cell strings and, on the other hand, as contact points for the second bypass element, so that no or only very short connecting lines are necessary for connecting the second bypass element.

In particular, it is advantageous that the second bypass element is connected between the first and the second cross connector, in particular is arranged between the first and the second cross connector, so that short connecting lines are achieved for connecting the second bypass element.

In one advantageous refinement, the first and the second cross connector are arranged on a common straight line. In this way, it is possible to connect the bypass element between the cross connectors without or only with short, straight connecting lines.

One particularly cost-effective and space-saving design results in an advantageous refinement in which the solar cell strings of the first and the second module segment are connected in parallel by means of the first cross connector and the solar cell strings of the third and the fourth module segment are connected in parallel by means of the second cross connector.

In a further advantageous embodiment, the solar cell module includes an edge cross connector, in particular a straight edge cross connector, which is arranged on the edges of the second and third module segment facing away from the first and the fourth module segment. By means of the edge cross connector, the solar cell strings of the second module segment are connected in parallel, the solar cell strings of the third module segment are connected in parallel, and the second and third module segment are connected in series by means of the edge cross connector. A particularly cost-effective and space-saving design results in this way.

In a further advantageous embodiment, the solar cell strings of the first module segment include the same number of solar cells as the solar cell strings of the fourth module segment and the solar cell strings of the second module segment include the same number of solar cells as the solar cell strings of the third module segment. A rectangular shape is enabled in a simple manner in this way. In addition, advantages result in the production, since at most two different solar cell strings are used.

The number of solar cells of each solar cell string of the four module segments is advantageously in the range of 5 to 65 solar cells.

In a further advantageous design, the solar cell strings of all module segments include the same number of solar cells. The advantage results in this way that in the production of the solar cell module, only one type of solar cell string having a uniform number of solar cells has to be uniformly provided to produce the solar cell module.

In an alternative advantageous embodiment, the solar cell strings of the first and the fourth module segment have twice as many solar cells as the solar cell strings of the second and the third module segment.

The advantage results in this way that all three bypass elements of an equal number of solar cells connected in series are connected in parallel. Identical or similar bypass elements can therefore be used.

The four module segments advantageously include the same number of solar cell strings. In this way, it is made possible in a simple manner for all module segments to supply the same amperage under normal conditions, so that no mismatch, and therefore no loss, results due to different amperages of the individual module segments.

Solar cells having identical performance data in the context of the typical manufacturing tolerances, in particular identical voltage and amperage at the optimum operating point under normal conditions are advantageously used for all module segments.

The number of the solar cell strings of the four module segments is advantageously in the range of two to eight solar cell strings per module segment.

The advantage results in this way that a desired output amperage in normal illumination is selectable by a corresponding number of the solar cell strings for each module segment.

It is within the scope of the invention that the solar cells of a solar cell string are connected in series using the methods known per se. In particular, the solar cells can be arranged in shingle technology, so that two adjacent solar cells are arranged overlapping and the electrical contacting of the two solar cells for the series connection is formed in the overlap area.

An overlapping arrangement of the solar cells of a string is also within the scope of the invention, wherein the solar cells are electrically connected in series by means of at least one cell connector. Such an arrangement is called a "negative gap" arrangement.

However, it is advantageous, to simplify the production process and to make use of established, known methods for producing solar cell strings, that according to one advantageous embodiment, in each case two adjacent solar cells of a solar cell string are electrically connected to at least one, preferably to at least two, in particular at least three cell connectors in order to form the series connection of the solar cells. It is within the scope of the invention that metallic elements having rectangular, round cross section or having structured surface are used as cell connectors.

As described at the outset, a module segment is distinguished in that a module segment includes solar cell strings connected in parallel. The solar cell strings in each of the four module segments are advantageously exclusively connected in parallel. A structurally simple design results in this way.

The bypass elements can be designed in a way known per se, in particular the design of the bypass diodes as diodes, in particular Schottky diodes, as MOSFETs or as an electronic switching unit and/or integrated circuits, in particular according to DE 102005012213 A1 and/or DE 10 2009 060 604 A1 is also within the scope of the invention.

The solar cell module advantageously includes a laminate, in which at least one, preferably all bypass elements are integrated.

It is within the scope of the invention that the solar cell module is structurally formed in a way known per se. In particular, it is within the scope of the invention that the solar cells of the solar cell module are arranged on a carrier plate and an optically transparent cover layer known per se for encapsulating the solar cells is arranged on the side facing toward the incident light during use. Furthermore, electrical contacts for connecting the solar cell module in a circuit are preferably arranged on the rear side on the solar cell module, in particular for connection to further solar cell modules.

Using solar cells known per se for converting incident radiation into electrical energy is within the scope of the invention.

In particular the use of partial solar cells, which result by dividing a larger base solar cell, in particular half or third cells as solar cells is within the scope of the invention.

The solar cells can include a semiconductor material as an absorbent material and one or more pn transitions for separating the charge carriers. Furthermore, using solar cells based on materials from the III and V main group of the Periodic Table (so-called III/V solar cells) or solar cells based on perovskite, in particular in combination with other materials, is within the scope of the invention.

Photovoltaic solar cells, in particular photovoltaic solar cells based on a silicon substrate, are advantageously used to form the solar cell strings. In this way, solar cells known per se and available on the market can be used.

Using bifacial solar cells to form the solar cell strings is within the scope of the invention. Such solar cells are designed for light absorption of the front and rear side of the solar cell. In this embodiment, the solar cell module preferably includes optically transparent layers on the front side and on the rear side of the solar cell module, so that radiation, in particular sunlight, is incident from both the front side and the rear side of the solar cell module through the encapsulation layers of the solar cell module on the solar cells.

In one advantageous design, all module segments of the solar cell module exclusively include solar cell strings connected in parallel and no solar cell strings connected in series. The advantage results in this way that a complex arrangement of the solar cell strings is omitted.

In an alternative advantageous embodiment, at least one module segment of the solar cell module includes at least one segment cross connector. The module segment is divided by the segment cross connector into partial segments, wherein each partial segment includes at least two parallel-connected solar cell strings. The segment cross connector is arranged between the partial segments to form a series connection of the partial segments. The advantage results in this way that module segments having a different size, in particular a different number of solar cells, can be used and nonetheless the use of solar cell strings having a uniform length, i.e., a uniform number of solar cells, is enabled by the arrangement of segment cross connectors.

Therefore, in the above-mentioned embodiment, all solar cell strings of the module segment having segment cross connector, preferably all solar cell strings of the solar cell module, advantageously include the same number of solar cells.

For a structurally simple design it is advantageous for the solar cell module to have four module segments.

In an alternative advantageous design, the solar cell module includes additional module segments, particularly preferably at least two, most preferably precisely two additional module segments. The additional module segments are advantageously each connected in series to another module segment of the solar cell module. In particular, it is advantageous to arrange a cross connector between the module segments.

In one advantageous design, the solar cell module includes a bypass element connected in parallel to the module segment for each additional module segment.

BRIEF DESCRIPTION OF THE DRAWINGS

Further preferred features and embodiments are explained hereinafter on the basis of exemplary embodiments and figures.

DETAILED DESCRIPTION

FIGS. 1 to 15 each show here an exemplary embodiment of a solar cell module according to the invention.

The figures show schematic representations which are not to scale. Identical reference signs in the figures identify identical or identically acting elements.

Figure 1:
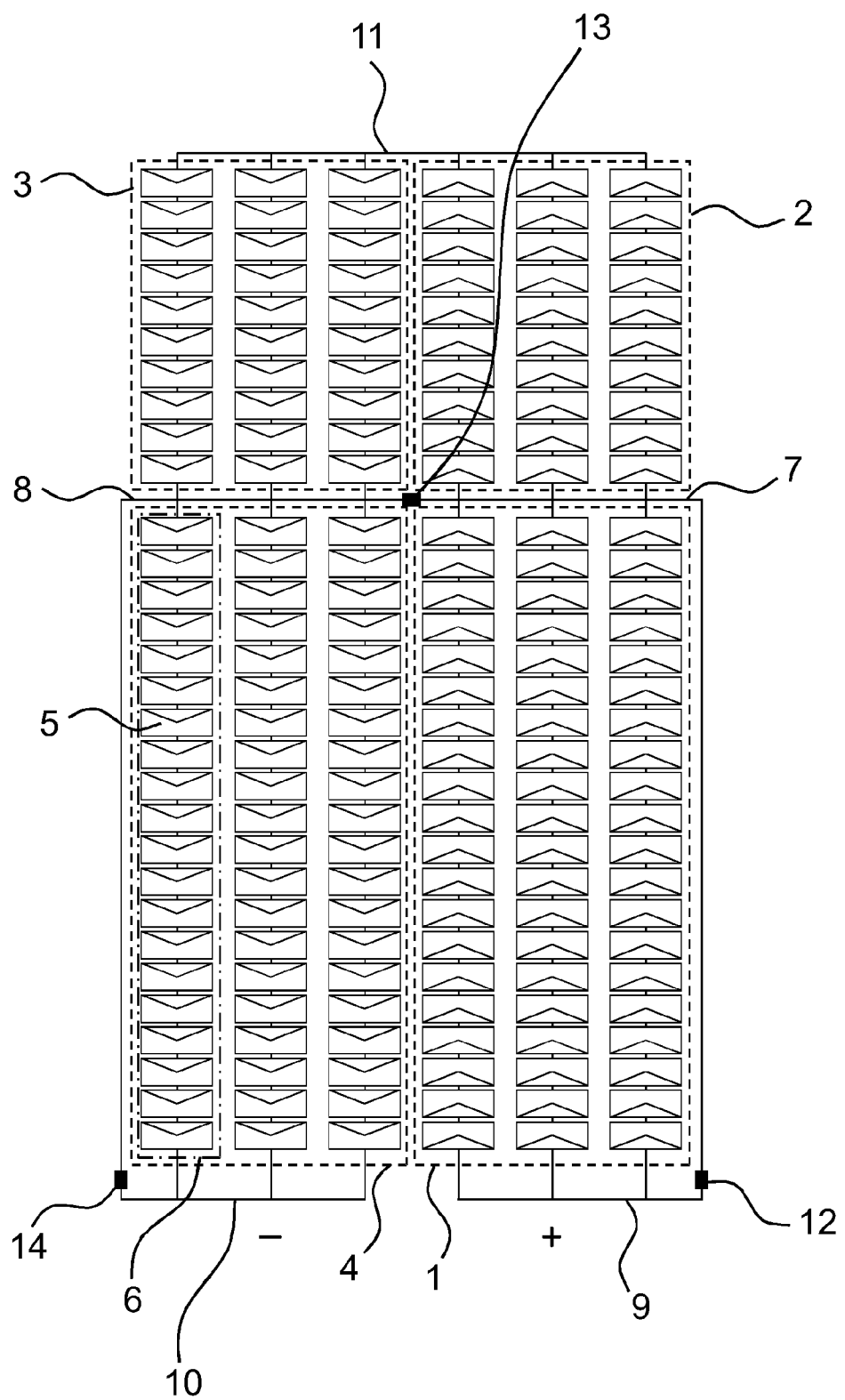
FIG. 1 shows a solar cell module according to the invention that includes four module segments.

The exemplary embodiment shown in FIG. 1 of a solar cell module according to the invention includes four module segments. The solar cells associated with the module segments 1, 2, 3, and 4 are each identified by dashed lines. The solar cells are schematically shown as rectangles, wherein the transmission direction of the solar cell is identified in each case by means of an arrow. As an example, a solar cell of the module segment 4 is identified by reference sign 5. Each of the module segments 1 to 4 includes three solar cell strings connected in parallel. The solar cell strings each include a plurality of solar cells connected in series. As an example, one solar cell string 6 of the module segment 4 is framed by a dot-dash line. This solar cell string 6 includes the solar cell 5. Module segment 1 and 4 therefore each include three solar cell strings connected in parallel, wherein each solar cell string includes 20 solar cells connected in series. The module segments 2 and 3 also each include three solar cell strings connected in parallel, wherein these each include ten solar cells connected in succession.

A first cross connector 7 is arranged between module segment 1 and 2. Both the solar cell strings of the module segment 1 and the solar cell strings of the module segment 2 are connected in parallel by means of this first cross connector 7. The series connection of module segment 1 and module segment 2 is also carried out by means of the first cross connector 7. A further cross connector 9 is arranged at the edge lying at the bottom according to the illustration in FIG. 1, in order to complete the parallel connection of the solar cell strings of the module segment 1.

At the edge lying at the top according to the illustration in FIG. 1, the solar cell module includes an edge cross connector 11. Both the solar cell strings of the module segment 2 and the solar cell strings of the module segment 3 are connected in parallel by means of the edge cross connector 11. In addition, the edge cross connector 11 is used for the series connection of the module segments 2 and 3.

A second cross connector 8 is arranged between module segment 3 and module segment 4, by means of which the solar cell strings of both the module segment 3 and the module segment 4 are connected in parallel. In addition, the series connection of module segment 3 and module segment 4 is carried out by means of the second cross connector 8.

The parallel connection of the solar cell strings of the module segment 4 is completed by means of a further cross connector 10.

The module segments two and three are thus connected in series between module segment 1 and 4.

The four module segments are arranged in two parallel series, wherein a representation rotated by 90° was selected for reasons of better illustration capability in the figures: a first series includes the first and second module segments (1, 2) and a second series includes the third and fourth module segments (3, 4). Accordingly, a first column includes the first and fourth module segments (1, 4) and a second column includes the second and third module segments (2, 3).

The solar cell module includes three bypass elements: a first bypass element 12 is connected in parallel to the first module segment 1, a second bypass element 13 is connected in parallel to the second and third module segments (2, 3) connected in series, and a third bypass element 14 is connected in parallel to the fourth module segment 4. The bypass elements 12, 13, and 14 are each designed as a bypass diode. Forming the bypass elements in an alternative embodiment as described above, for example each as a MOSFET, is also within the scope of the invention.

Due to this configuration, even upon shading of a complete margin series of solar cells, a residual output power of the solar cell module always remains: For example, if the solar cell series arranged on the right in FIG. 1 is entirely or partially shaded, i.e., the right-hand solar cell string of the module segment 1 and the right-hand solar cell string of the module segment 2, an electrical output power achieved by module segment 4 nonetheless remains. If the solar cell series located at the top in FIG. 1 is entirely or partially shaded, i.e., the upper solar cells from each of the module segments 2 and 3, output powers of the module segments 1 and 4 nonetheless remain.

If the solar cell series located at the left edge in FIG. 1 and thus solar cells of the module segments 3 and 4 are accordingly entirely or partially shaded, the output power of the module segment 1 remains. If the solar cell series located at the bottom in FIG. 1 is entirely or partially shaded, i.e., the solar cells of the module segments 1 and 4 located at the bottom in each case, the output power of the module segments 2 and 3 remains.

This advantageous behavior is achieved by the configuration shown, wherein only three bypass elements are required at the same time.

The second bypass element 13 is arranged between the first and the second series, in the present case in the middle between the first and the second series, of the module segments and is also arranged between the first and second column, in the present case in the middle between the first and second column. In particular, in this exemplary embodiment the second bypass element is arranged in a middle area at which the four module segments 1, 2, 3, 4 adjoin.

In the exemplary embodiment shown in FIG. 1, the first cross connector 7 and the second cross connector 8 are arranged on a common straight line. The second bypass element 13 is connected and arranged between first and second cross connector (7, 8). As is apparent in FIG. 1, therefore only very short line connections are necessary for connecting the second bypass element 13 to the first cross connector 7 and the second cross connector 8.

In the exemplary embodiment shown in FIG. 1, the solar cell strings of the first module segment 1 include the same number of solar cells as the solar cell strings of the fourth module segment 4 and the solar cell strings of the second module segment 2 include the same number of solar cells as the solar cell strings of the third module segment 3. In this way, the production of the solar cell module is simplified, since only solar cell strings in two lengths have to be provided. In addition, a parallel connection of 20 solar cells connected in series is carried out in each case using all three bypass elements 12, 13, 14. In the case of the first bypass element 12 and third bypass element 14, these are the solar cells of the solar cell strings of the module segments 1 and 4. In the case of the second bypass element 13, these are the solar cell strings connected in succession of the module segments 2 and 3.

In this design, the solar cell strings of the first and the fourth module segment thus include twice as many solar cells as the solar cell strings of the second and third module segment.

In this way, the same requirements on the switching behavior are present in all three bypass elements, i.e., identical bypass elements can advantageously be used.

The four module segments 1 to 4 each include three solar cell strings connected in parallel and thus the same number of solar cell strings.

In all solar cell strings of the exemplary embodiment shown in FIG. 1, in each case two adjacent solar cells of a solar cell string are connected in the present case using five cell connectors to achieve the series connection. The three cell connectors are shown by a line between the solar cells in the drawings for better clarity.

Furthermore, in the exemplary embodiment shown in FIG. 1, the solar cell strings are exclusively connected in parallel in each of the four module segments 1 to 4.

At the edge lying at the bottom in FIG. 1, the position is schematically identified by symbols "+" and "−", at which on the rear on the solar cell module, the positive and negative contact are arranged for connecting the solar cell module to an external circuit, in particular to further solar cell modules.

Figure 2:
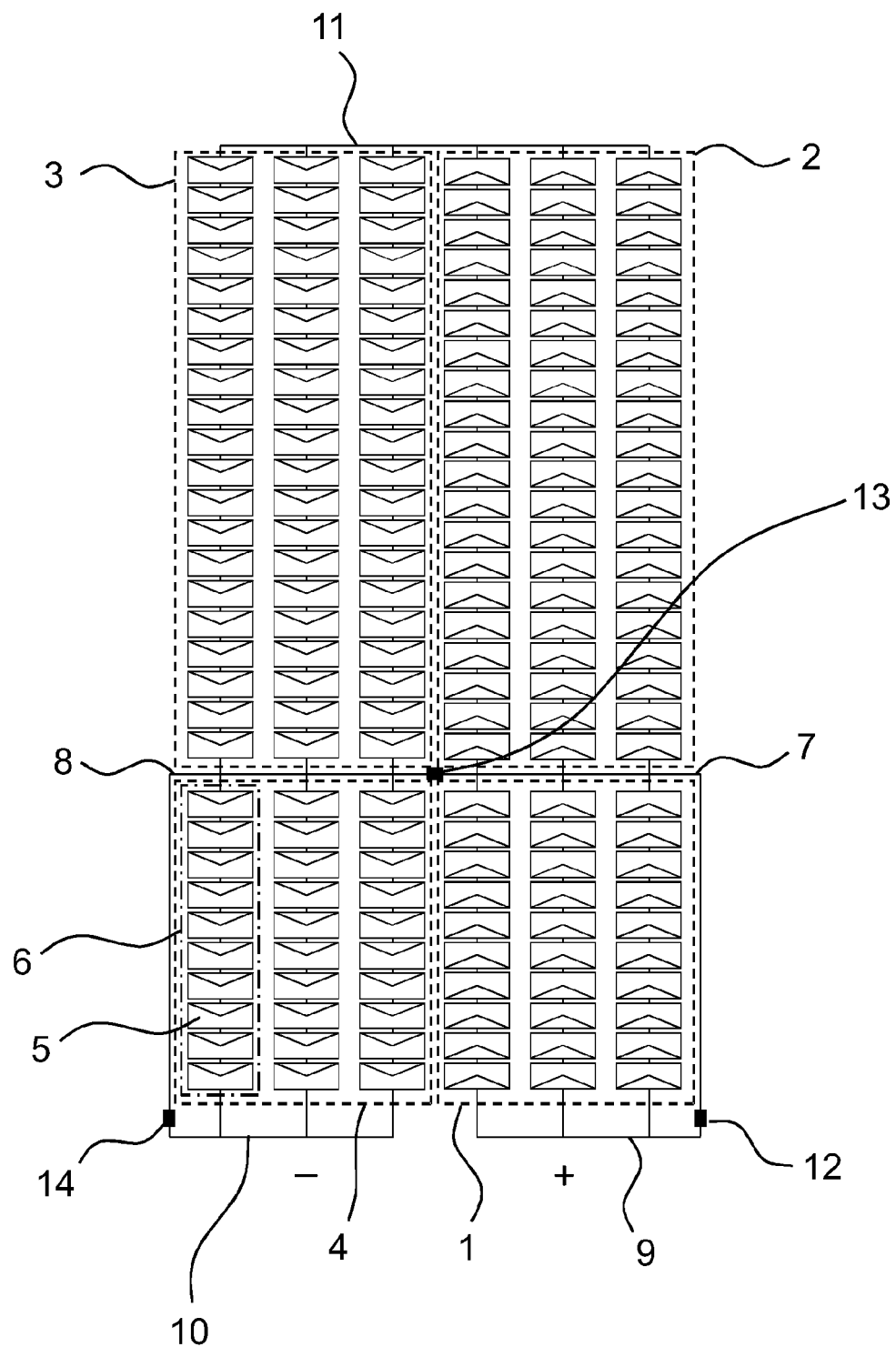
FIGS. 2 to 13 show additional embodiments of solar cell modules according to the invention.

FIGS. 2 to 13 each show modified exemplary embodiments. To avoid repetitions, only the significant differences from the exemplary embodiment shown in FIG. 1 are discussed hereinafter:

In the exemplary embodiment shown in FIG. 2, the solar cell strings of the module segments 2 and 3 each include 20 solar cells and the solar cell strings of the module segments 1 and 4 each include ten solar cells and thus half of the solar cells of the solar cell strings of the module segments 2 and 3.

The advantage results in this way that a shorter length of the cross connectors is required in parallel to module segment 1.

Figure 3:
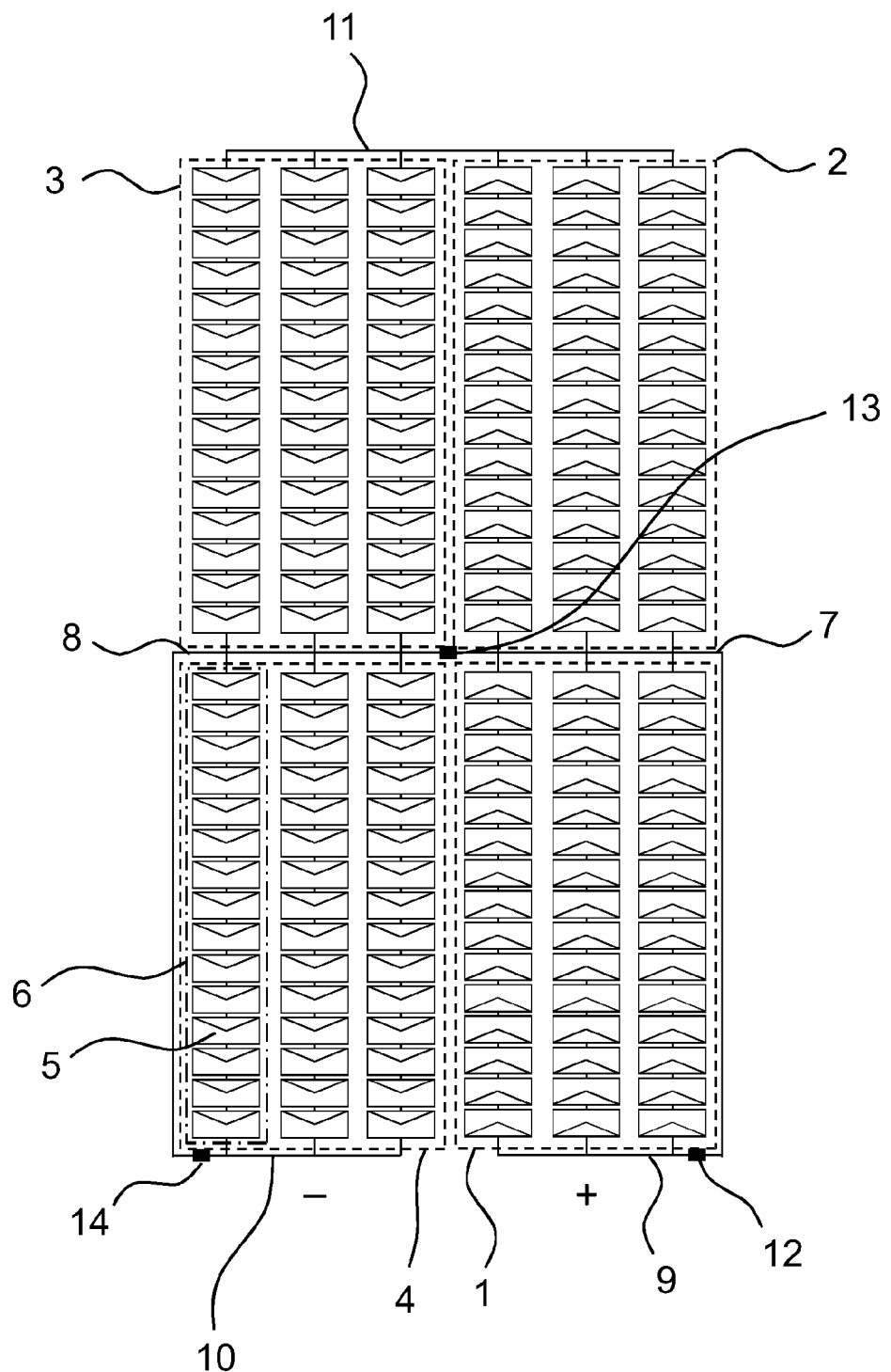

In the exemplary embodiment shown in FIG. 3, all solar cell strings each include 15 solar cells. The advantage results in this way that during production only one type of solar cell string having 15 solar cells in the present case has to be provided.

Figure 4:
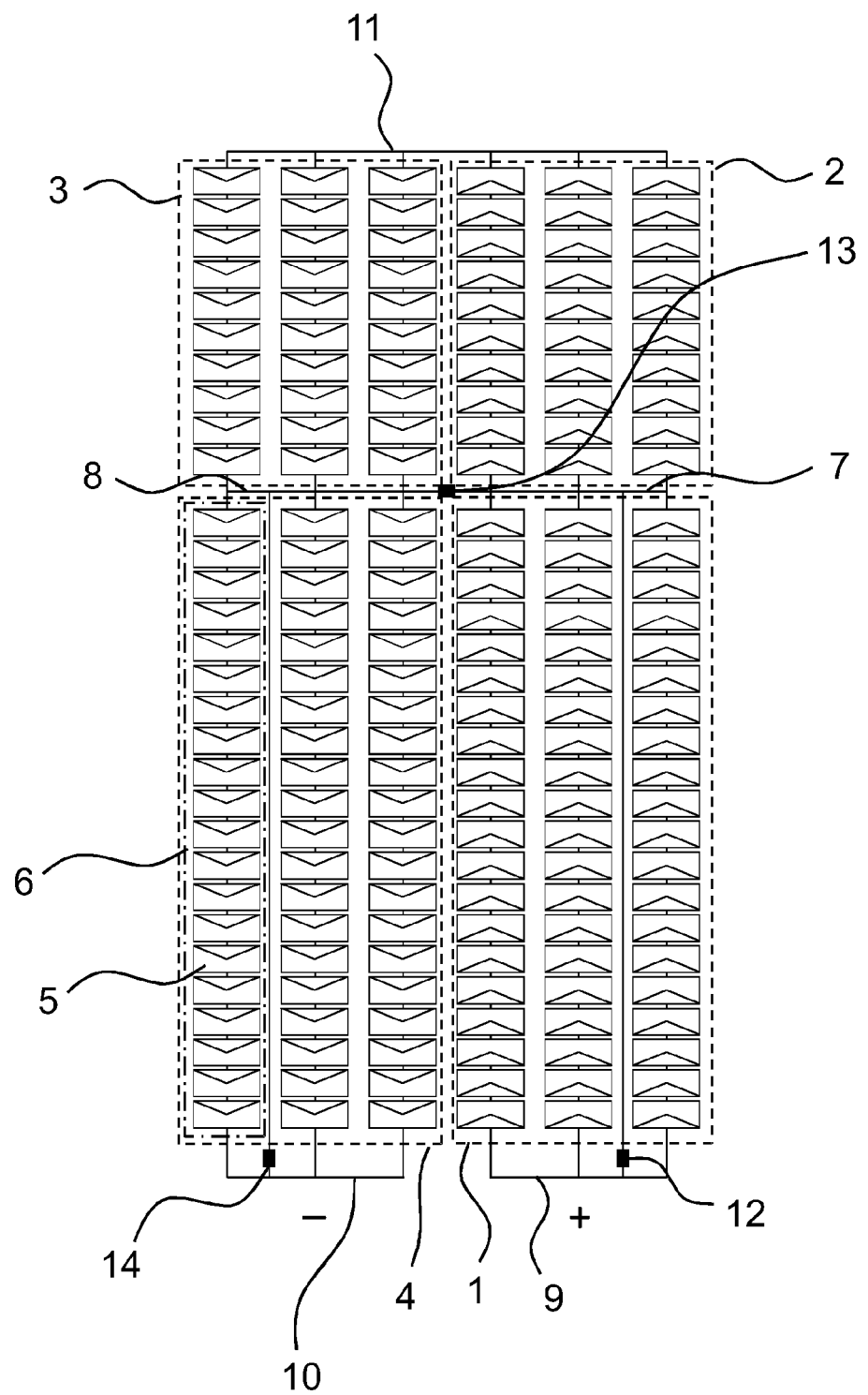

In the exemplary embodiment shown in FIG. 4, the connecting lines of the first bypass element 12 and the third bypass element 14 are laid on the inside of the respectively outer solar cell strings of the module segments 1 and 4. In the exemplary embodiment shown in FIG. 1, in contrast, the connecting lines of the first bypass element 12 and the third bypass element 14 extend on the outside of the module segments 1 and 4.

The exemplary embodiment shown in FIG. 4 has the advantage that an electrical insulation between a metallic module frame of the solar cell module and the cross connectors is implementable in a structurally simple manner.

Figure 5:
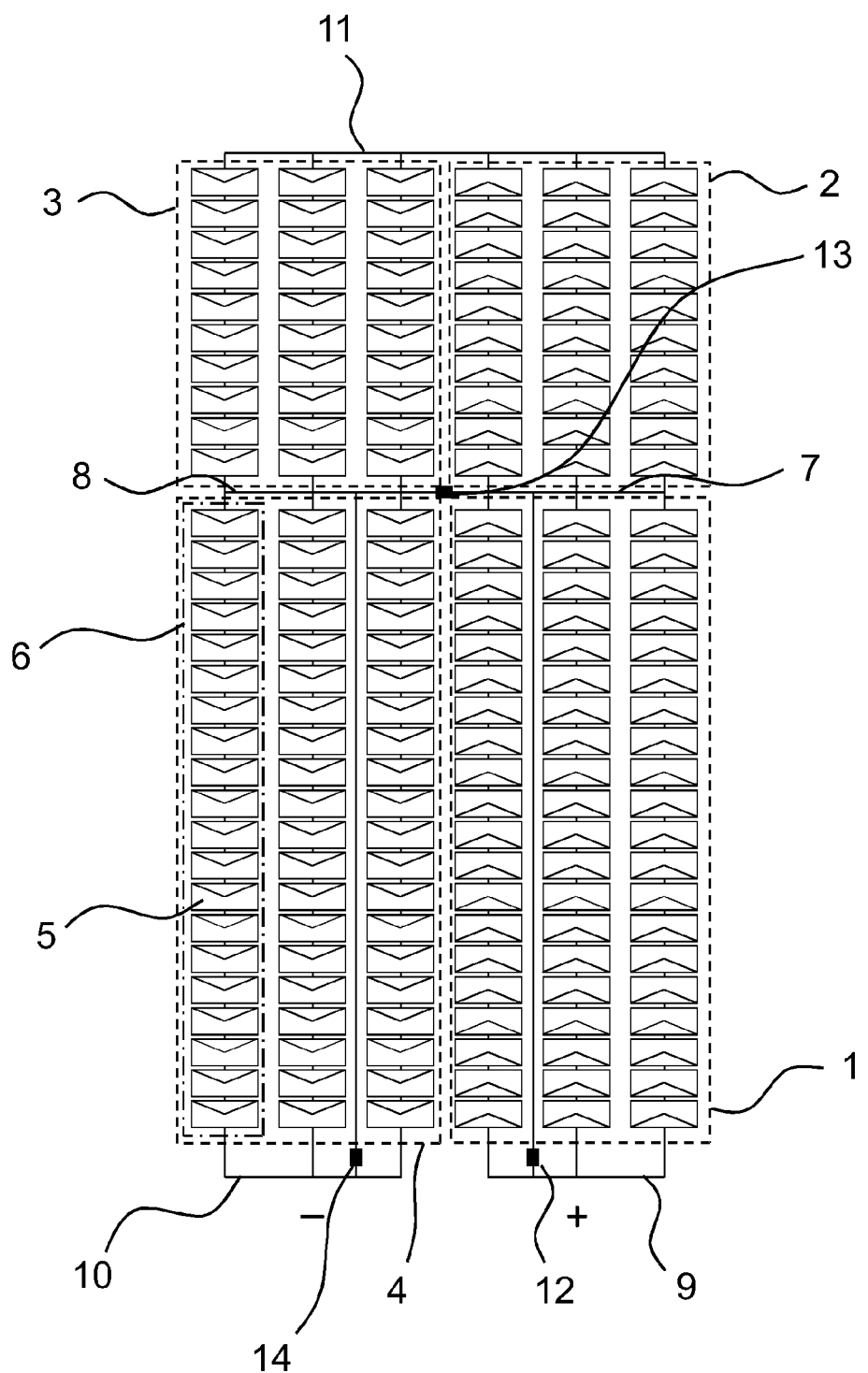

FIG. 5 shows a further exemplary embodiment in which the connecting lines of the first bypass element 12 and the third bypass element 14 were once again laid further inward in relation to the exemplary embodiment shown in FIG. 4: The connecting lines now extend between the two inner solar cell strings of the module segments 1 and 4. In this way, the advantages mentioned for the exemplary embodiment shown in FIG. 4 result.

Figure 6:
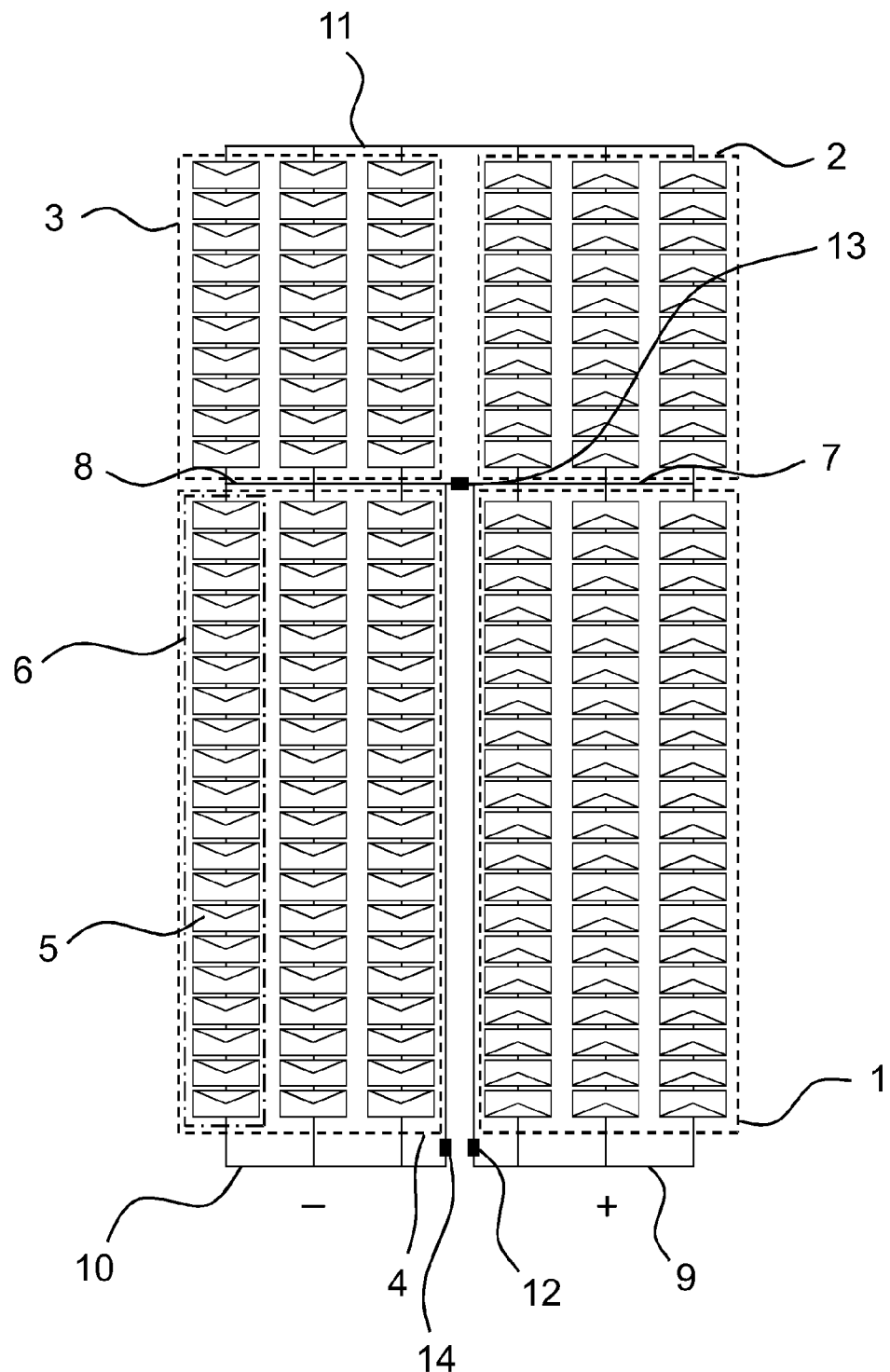

In the exemplary embodiment shown in FIG. 6, the connecting lines of the first bypass element 12 and the third bypass element 14 were finally laid completely inward and now extend between the module segments 1 and 4. The advantage results in this way that the cross connectors can also be arranged one over another. The bypass elements 12 and 14 of the module segments 1 and 4 can also be arranged in a common connection socket.

Figure 7:
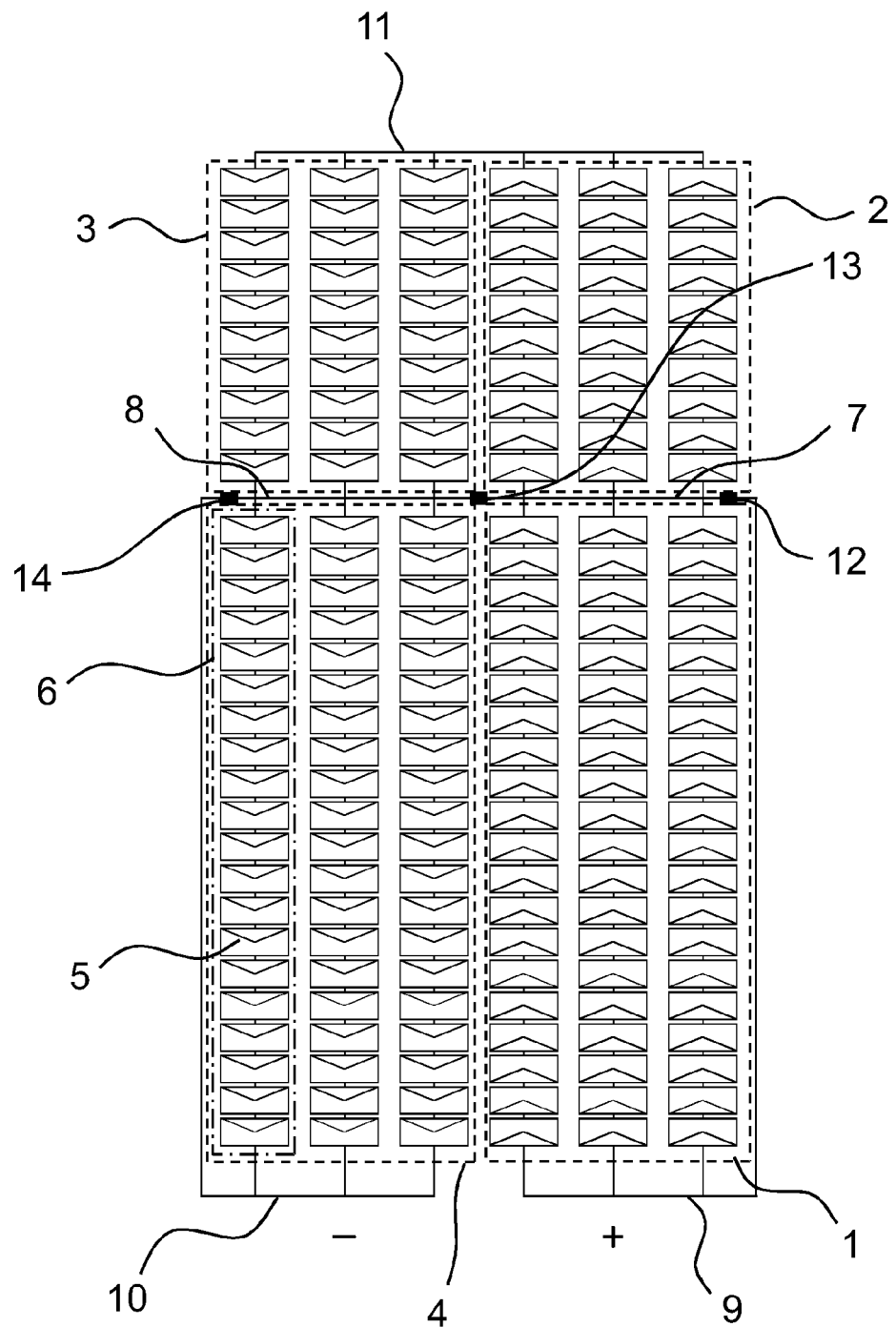

The exemplary embodiment according to FIG. 7 shows a configuration having connecting lines according to the exemplary embodiment shown in FIG. 1. However, the position of the first bypass element 12 and the third bypass element 14 is selected in the exemplary embodiment according to FIG. 7 in such a way that the first bypass element 12 is arranged directly on the outside of the first cross connector 7 and the third bypass element 14 is arranged directly on the outside of the second cross connector 8. In addition, the three bypass elements 12, 13, and 14 are located on a common straight line, on which the first cross connector 7 and the second cross connector 8 are also arranged.

The advantage results in this way that three connection sockets located in a series can be used in a structurally simple manner, wherein one of the three bypass element is arranged in each case in each connection socket.

Figure 8:
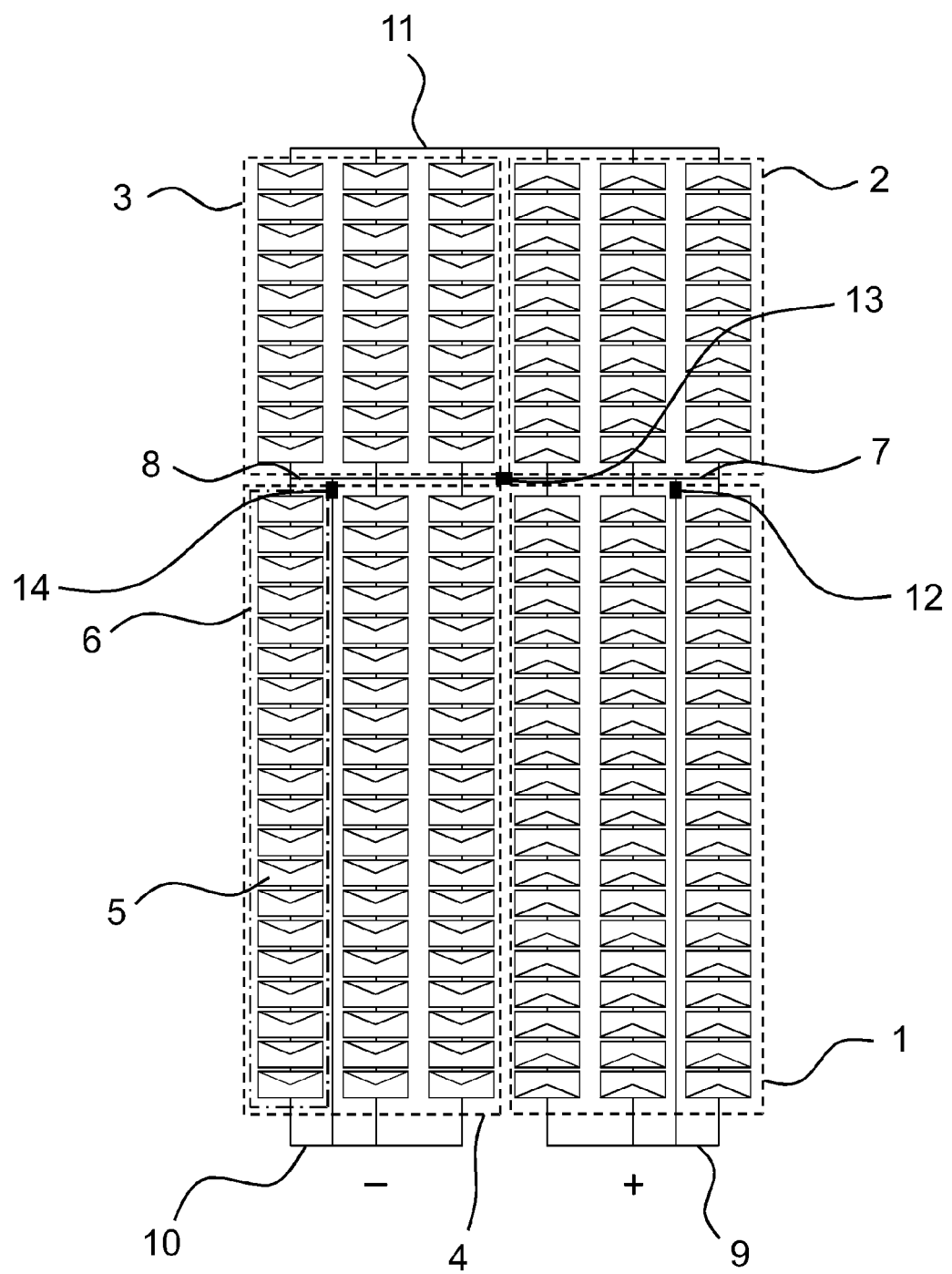

The exemplary embodiment shown in FIG. 8 represents a combination of the exemplary embodiment shown in FIG. 4 and of the exemplary embodiment shown in FIG. 7: The first bypass element 12 is arranged in the area of the first cross connector 7 and the third bypass element 14 is arranged in the area of the second cross connector 8, however, the first and the third bypass element are not arranged at a respective end of the associated cross connector, rather in an area on the inside of the respective marginal solar cell string of the associated module segment.

The advantages mentioned for the exemplary embodiment shown in FIG. 4 and FIG. 7 result in this way.

Figure 9:
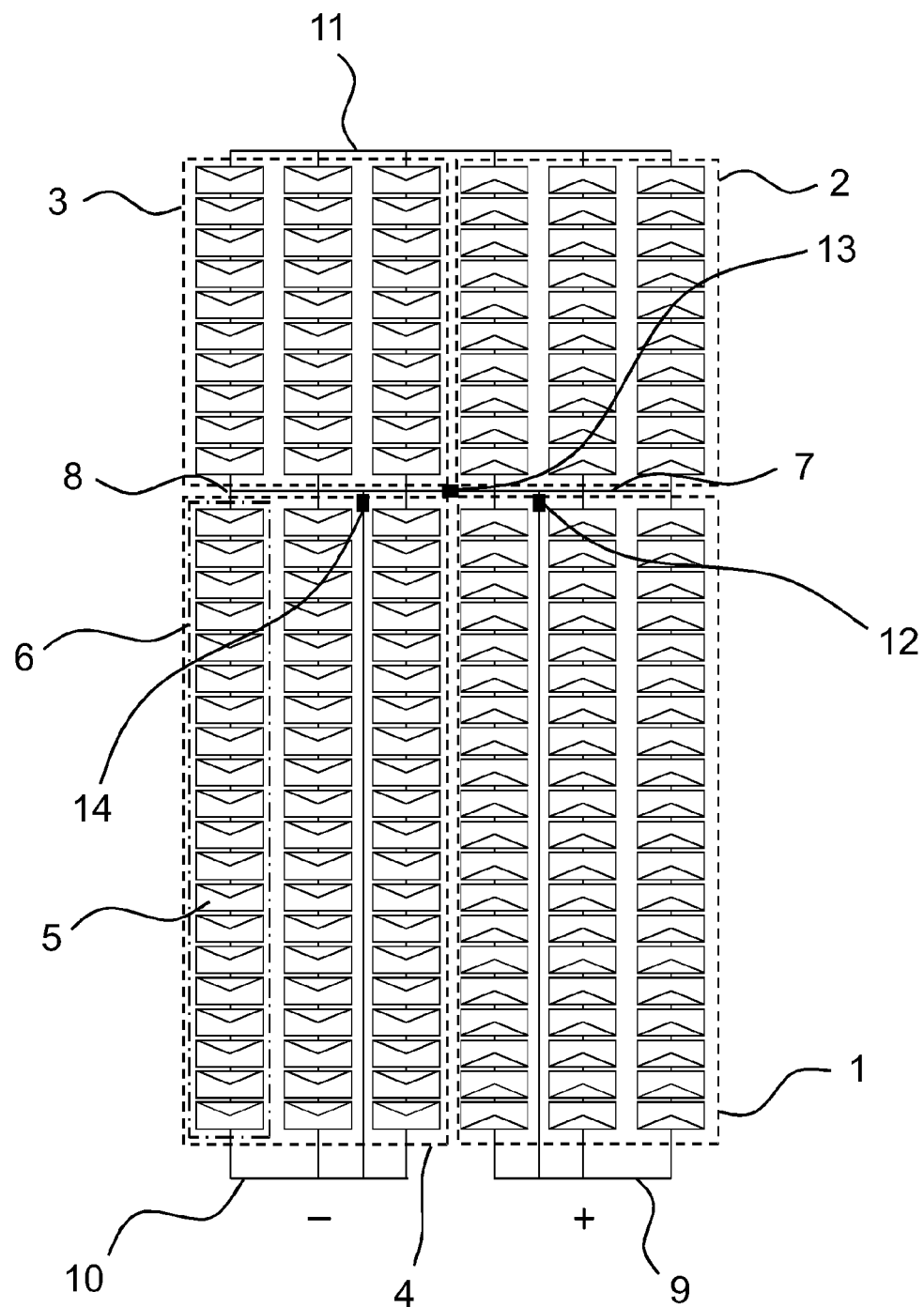

FIG. 9 shows an exemplary embodiment which, analogously to FIG. 8, represents a combination of the exemplary embodiment according to FIG. 5 and FIG. 7. In this way, the advantages mentioned for the exemplary embodiment shown in FIG. 5 and FIG. 7 result.

Figure 10:
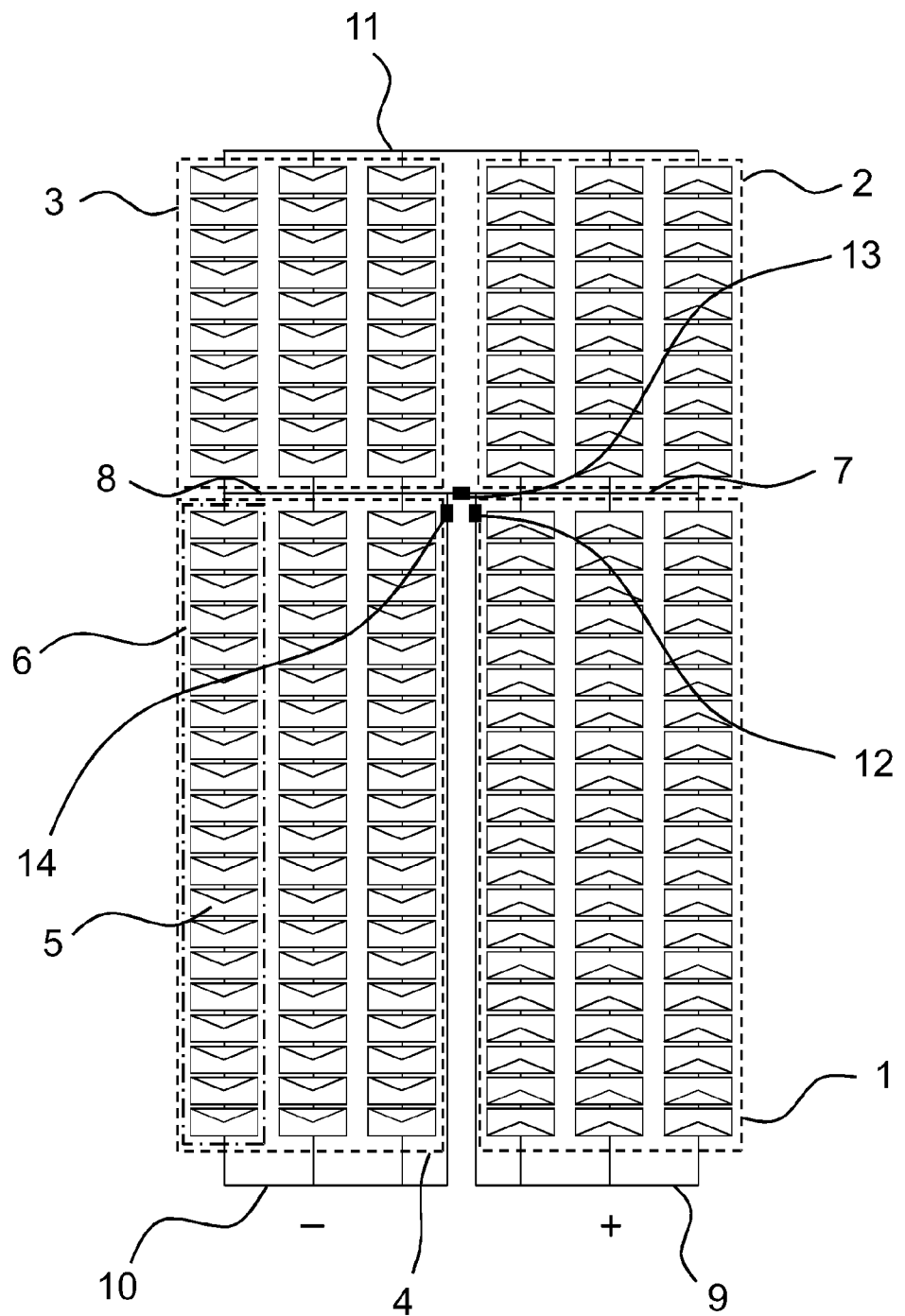

Finally, an exemplary embodiment is shown in FIG. 10, in which the connecting lines of the first bypass element 12 and the third bypass element 14 are arranged between the module segment 1 and 4.

In this exemplary embodiment, the three bypass elements 12, 13, and 14 are arranged in a common middle area, to which the four module segments 1 to 4 adjoin.

In this way, the advantages mentioned for the exemplary embodiment shown in FIG. 6 result. Furthermore, the advantage results that all bypass elements can be arranged in one connection socket.

It is within the scope of the invention that the solar cell module includes further module segments. In particular, it is within the scope of the invention that the described configuration of the four module segments is repeated multiple times.

Figure 11:
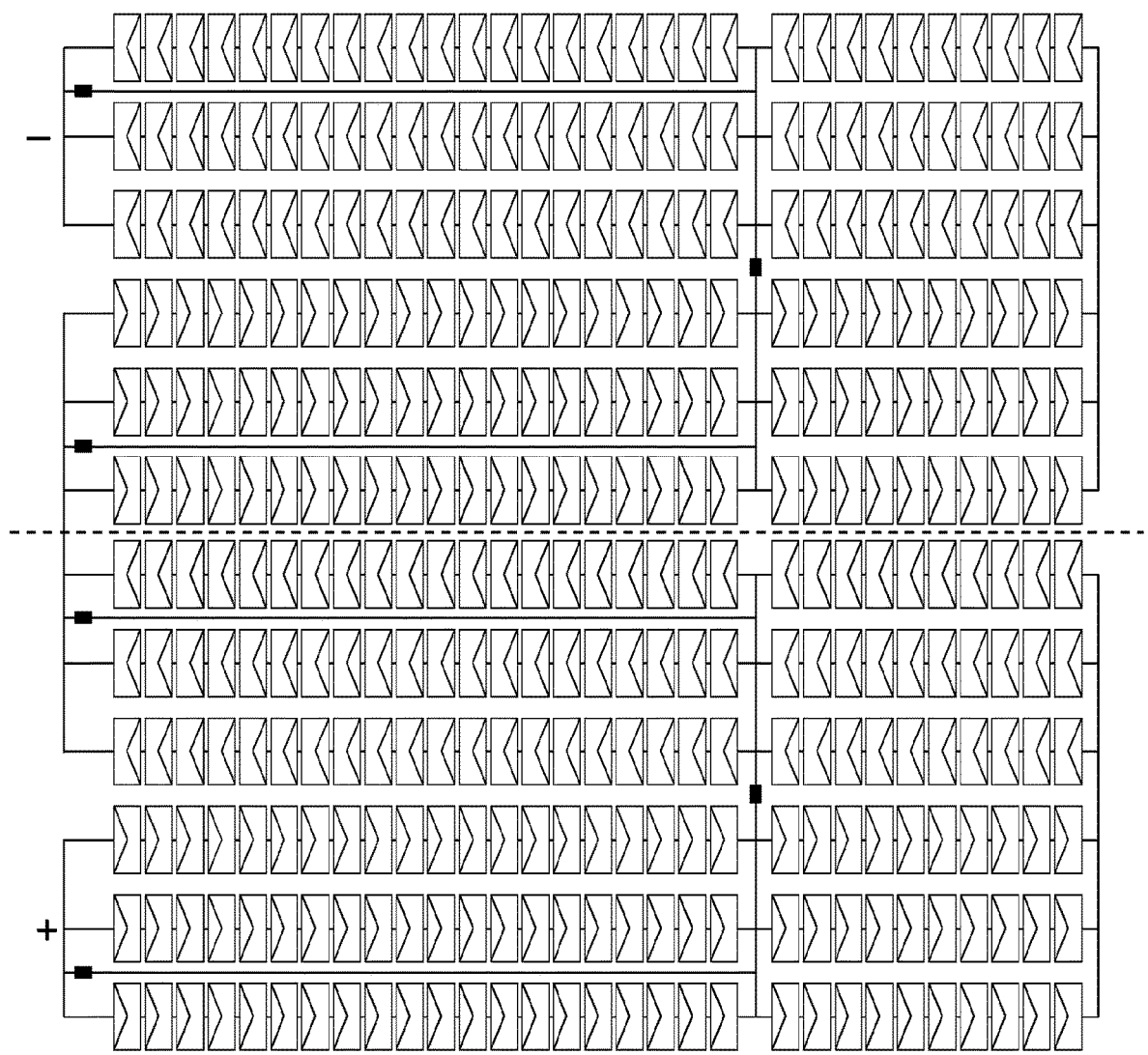

FIG. 11 shows an exemplary embodiment in which according to the illustration in FIG. 11, two configurations each having four module segments are connected in series lying one above the other. The configuration below the dashed line in FIG. 11 and the configuration above the dashed line in FIG. 11 each correspond to the design shown in FIG. 4, wherein a rotation by 90° took place in relation to FIG. 4 for reasons of better illustration capability.

The configuration according to FIG. 11 therefore corresponds to the configuration according to FIG. 4 with a mirror axis at the right edge of the illustration according to FIG. 4.

Figure 12:
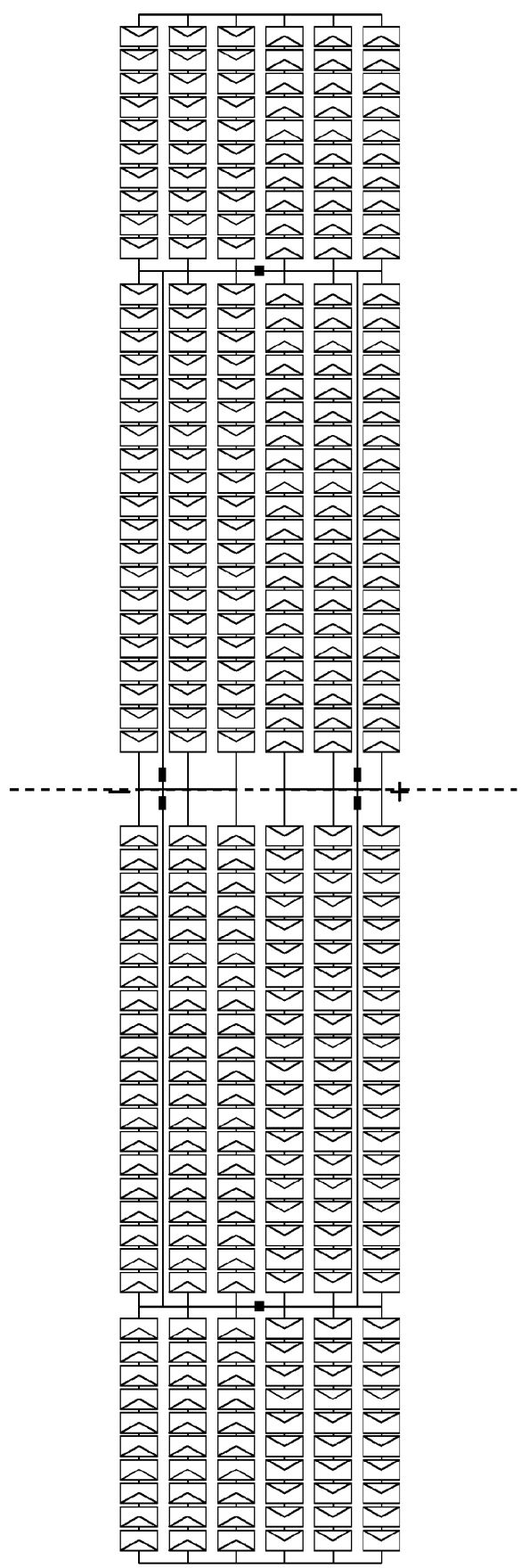
Figure 13:
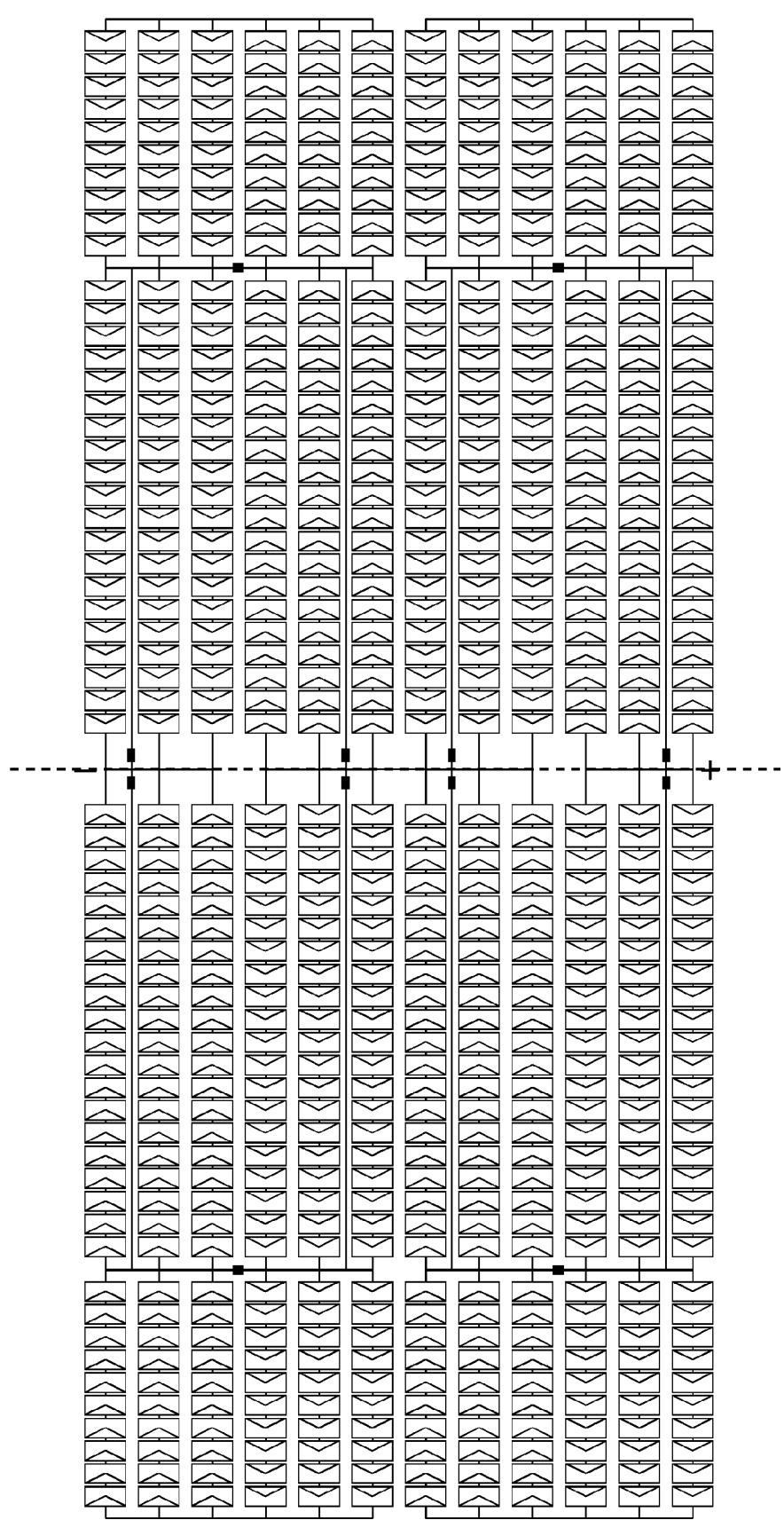

FIG. 12 shows a further exemplary embodiment which also comprises two configurations according to FIG. 4. Such a design is achieved in that the configuration according to FIG. 4 is mirrored at a horizontal mirror axis lying at the bottom.

The exemplary embodiments shown in FIGS. 11 and 12 are formed mirror symmetric to the line shown with dashes in the middle in each case.

Different aspect ratios of length to width of the solar cell module in comparison to the above-described exemplary embodiments can be implemented by the exemplary embodiments shown in FIGS. 11 and 12.

The above-described configuration of the four module segments is also suitable for constructing large solar cell modules having a large number of solar cells. A further exemplary embodiment is shown by way of example in FIG. 13, which is achieved by a renewed reflection of the exemplary embodiment shown in Figure twelve at a vertical mirror axis at the right edge.

Figure 14:
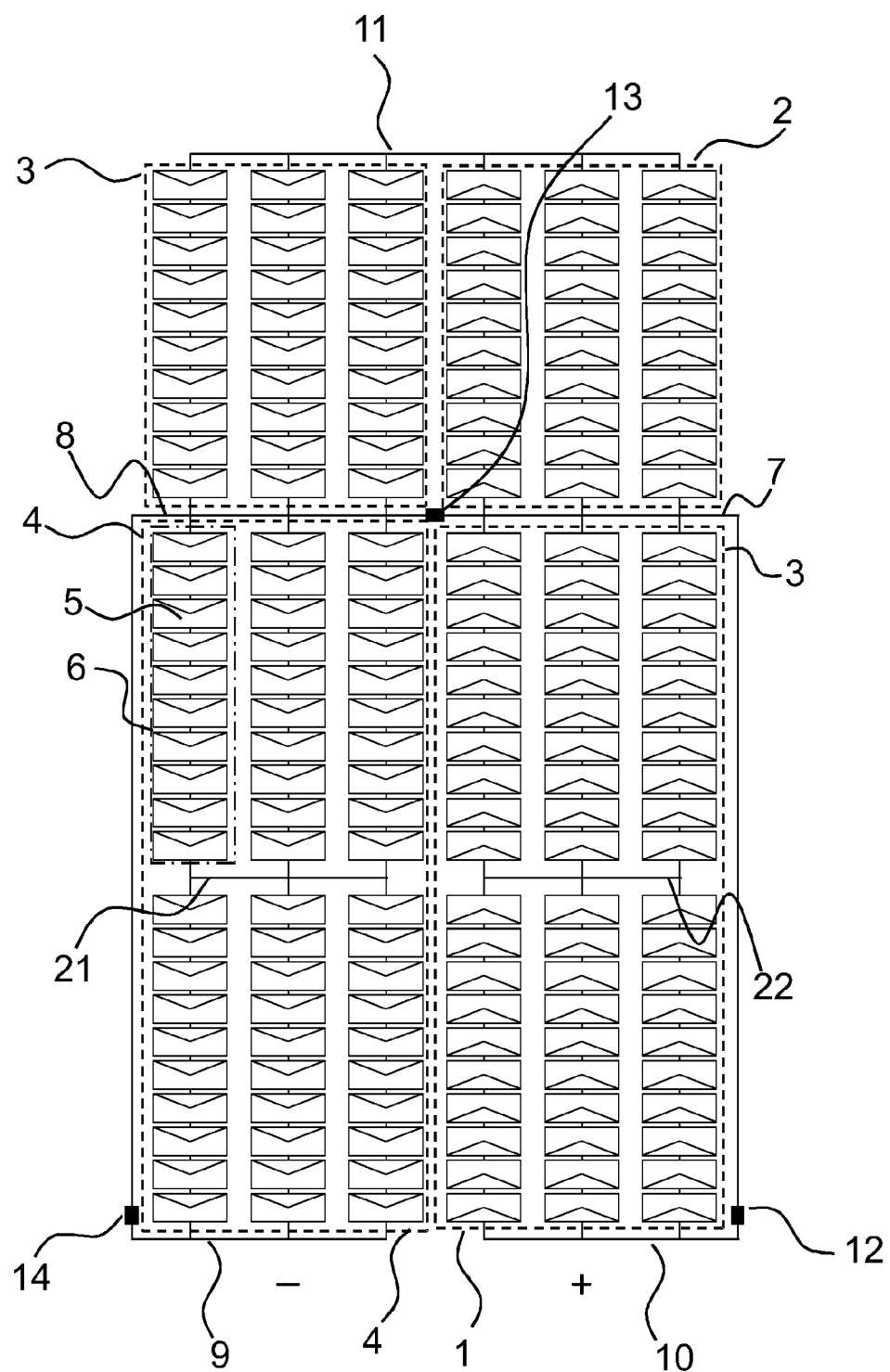
FIG. 14 shows an exemplary embodiment which represents a modification of the exemplary embodiment shown in FIG. 1.

FIG. 14 shows an exemplary embodiment which represents a modification of the exemplary embodiment shown in FIG. 1. In the exemplary embodiment shown in FIG. 14, the first module segment 1 includes a segment cross connector 22 and the fourth module segment 4 includes a segment cross connector 21. The first module segment 1 and the fourth module segment 4 are thus each divided by the segment cross connector into two partial segments. Each partial segment includes three solar cell strings 6 connected in parallel each having ten solar cells 5 connected in series. The segment cross connectors 21, 22 are each arranged between the two partial segments, so that by means of the segment cross connectors, on the one hand, the parallel connection of the solar cell strings of the partial segments is formed and, on the other hand, the series connection of the partial segments of the module segment is formed.

The exemplary embodiment shown in FIG. 14 has the advantage over the exemplary embodiment shown in FIG. 1 that exclusively solar cell strings having uniform length are used, in the present case having ten solar cells.

Figure 15:
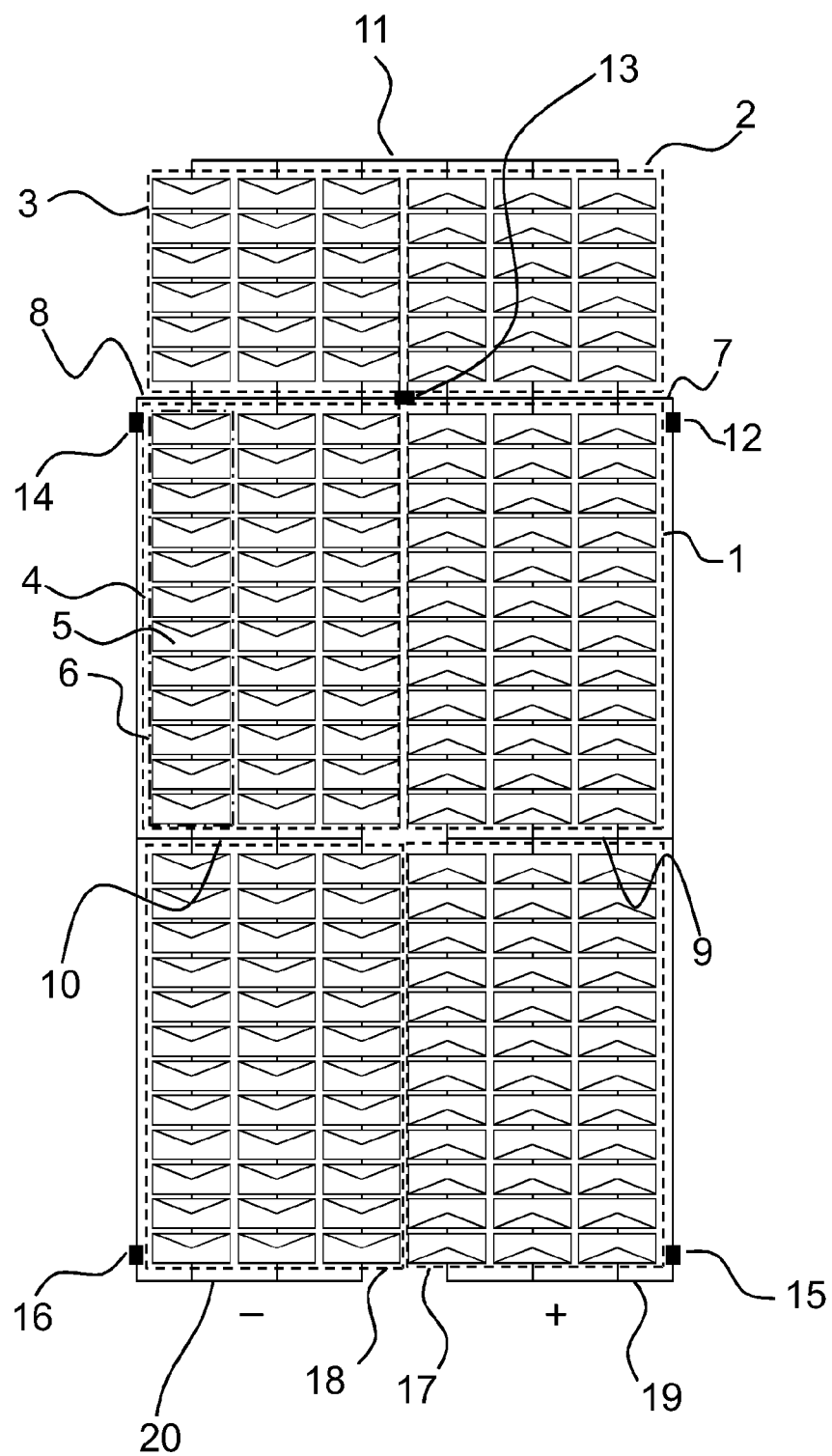
FIG. 15 shows a further exemplary embodiment, which includes six module segments.

FIG. 15 shows a further exemplary embodiment, which includes a total of six module segments. The basic structure corresponds to the exemplary embodiment shown in FIG. 1, wherein the second module segment 2 and the third module segment 3 include solar cell strings having only five solar cells 5 connected in series in the exemplary embodiment shown in FIG. 15, whereas the second module segment 2 and the third module segment 3 include solar cell strings having ten solar cells in the exemplary embodiment shown in FIG. 1.

Furthermore, the exemplary embodiment shown in FIG. 15 additionally includes a fifth module segment 17 and a sixth module segment 18. These two additional module segments each also include three parallel-connected solar cell strings 6 each having ten solar cells 5 connected in series. The fifth module segment 17 is connected in series to the first module segment 1 and the sixth module segment 18 is connected in series to the fourth module segment 4. For this purpose, a cross connector 9 is arranged between the fifth module segment 17 and the first module segment 1 and a cross connector 10 is arranged between the sixth module segment 18 and the fourth module segment 4.

The solar cell module according to the exemplary embodiment shown in FIG. 15 includes two additional bypass elements: a fourth bypass element 15 is connected in parallel to the fifth module segment 17 and a fifth bypass element 16 is connected in parallel to the sixth module segment 18.

In addition, a cross connector 20 is provided for the sixth module segment 18 and a cross connector 19 is provided for the fifth module segment 17, to complete the parallel connection of the solar cell strings of the module segments and to provide terminal points for connecting the module segment for a positive external terminal (+) and a negative external terminal (−).

The exemplary embodiment shown in FIG. 15 has the advantage that solar cell strings having 10 solar cells connected in series are associated in each case with each of the bypass elements 12, 13, 14, 15, 16.

LIST OF REFERENCE NUMERALS module segment 1, 2, 3, 4, 17, 18
solar cell 5
solar cell string 6
first cross connector 7
second cross connector 8
cross connector 9, 10, 19, 20
edge cross connector 11
first bypass element 12
second bypass element 13
third bypass element 14
fourth bypass element 15
fifth bypass element 16
segment cross connector 21, 22

The invention claimed is:

1. A solar cell module, comprising:
at least four module segments (1, 2, 3, 4);
a plurality of bypass elements;
each of the four module segments (1, 2, 3, 4) includes at least two solar cell strings connected in parallel and each of the solar cell strings (6) includes a plurality of solar cells connected in series and the four module segments (1, 2, 3, 4) are connected in series;
a second and a third of the four module segments (1, 2, 3, 4) are connected in series between a first and a fourth of the four module segments;
the four module segments are arranged in two parallel series, having a first series, which includes the first and the second module segments (1, 2), and a second series, which includes the third and the fourth module segments (3, 4);
a first bypass element (12) is connected in parallel to the first module segment (1), a second bypass element (13) is connected in parallel to the second and third module segments (2, 3) connected in series, and a third bypass element (14) is connected in parallel to the fourth module segment (4);
wherein at least one of the module segments (1, 2) includes at least two partial segments having at least two of the solar cell strings connected in parallel and the module segment includes a segment cross connector (21, 22), which is arranged between the partial segments of the module segment (1, 2), to form a series connection of the partial segments; and
a first cross connector (7) for parallel connection of the solar cell strings of at least one of the first module segment or the second module segment arranged between first and second module segment (1, 2), a second cross connector (8) for parallel connection of the solar cell strings of at least one of the third module segment or the fourth module segment arranged between third and fourth module segment (3, 4), and the second bypass element (13) is connected between the first and the second cross connector.

2. The solar cell module as claimed in claim 1, wherein the second bypass element (13) is arranged between the first and the second series.

3. The solar cell module as claimed in claim 1, wherein the first and the second cross connector (7, 8) are arranged on a common, straight line.

4. The solar cell module as claimed in claim 1, wherein the solar cell strings of the first module segment and the second module segment (1, 2) are connected in parallel by the first cross connector (7) and the solar cell strings of the third module segment and the fourth module segment (3, 4) are connected in parallel by the second cross connector (8).

5. The solar cell module as claimed in claim 1, further comprising an edge cross connector (11) arranged on edges of the second module segment and third module segment facing away from the first module segment and the fourth module segment and by which: the solar cell strings of the second module segment (2) are connected in parallel, the solar cell strings of the third module segment (3) are connected in parallel, and second and third module segment are connected in series.

6. The solar cell module as claimed in claim 1, wherein the solar cell strings of the first module segment (1) include a same number of solar cells as the solar cell strings of the fourth module segment (4) and the solar cell strings of the second module segment (2) include a same number of solar cells as the solar cell strings of the third module segment (3).

7. The solar cell module as claimed in claim 1, wherein the solar cell strings of all of the module segments (1, 2, 3, 4) include a same number of solar cells or the solar cell strings of the first module segment and the fourth module segment (1, 2) include twice as many of the solar cells as the solar cell strings of the second module segment and the third module segment (2,3).

8. The solar cell module as claimed in claim 1, wherein the four module segments (1, 2, 3, 4) include a same number of solar cell strings.

9. The solar cell module as claimed in claim 1, wherein a number of the solar cell strings of the four module segments (1, 2, 3, 4) is in a range of 2 to 8 per module segment.

10. The solar cell module as claimed in claim 1, wherein a number of the solar cells of each said solar cell string of the four module segments (1, 2, 3, 4) is in a range of 5 to 65 solar cells.

11. The solar cell module as claimed in claim 1, wherein in each case two adjacent ones of the solar cells of one of the solar cell strings are connected to at least one cell connector.

12. The solar cell module as claimed in claim 1, further comprising at least one further module segment (17, 18) having at least two solar cell strings connected in parallel, which is connected in series to at least one of the other module segments (1, 2, 3, 4).

13. The solar cell module as claimed in claim 12, further comprising a further bypass element (15, 16), which is connected in parallel to the further module segment (17, 18).

* * * * *